United States Patent
Liao et al.

(10) Patent No.: US 10,411,328 B2
(45) Date of Patent: Sep. 10, 2019

(54) PATCH ANTENNA STRUCTURES AND METHODS

(71) Applicant: TAIWAN SEMICONDUCTOR MANUFACTURING COMPANY, LTD., Hsinchu (TW)

(72) Inventors: Wen-Shiang Liao, Toufen Township (TW); Feng Wei Kuo, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/705,501

(22) Filed: Sep. 15, 2017

(65) Prior Publication Data

US 2019/0089038 A1    Mar. 21, 2019

(51) Int. Cl.

| | |
|---|---|
| *H01Q 1/22* | (2006.01) |
| *H01Q 1/24* | (2006.01) |
| *H01Q 1/48* | (2006.01) |
| *H01Q 9/04* | (2006.01) |
| *H01L 21/48* | (2006.01) |
| *H01L 23/66* | (2006.01) |
| *H01L 21/56* | (2006.01) |
| *H01L 23/31* | (2006.01) |
| *H01Q 21/06* | (2006.01) |
| *H04B 1/403* | (2015.01) |
| *H01L 21/683* | (2006.01) |
| *H01L 23/498* | (2006.01) |

(52) U.S. Cl.
CPC ............ *H01Q 1/24* (2013.01); *H01L 21/486* (2013.01); *H01L 21/4857* (2013.01); *H01L 21/565* (2013.01); *H01L 23/49827* (2013.01); *H01L 23/66* (2013.01); *H01Q 1/2283* (2013.01); *H01Q 9/0407* (2013.01); *H01Q 21/065* (2013.01); *H04B 1/403* (2013.01); *H01L 21/6835* (2013.01); *H01L 23/3128* (2013.01); *H01L 23/49816* (2013.01); *H01L 23/49822* (2013.01); *H01L 23/49838* (2013.01); *H01L 2221/68359* (2013.01); *H01L 2223/6677* (2013.01); *H01Q 1/48* (2013.01)

(58) Field of Classification Search
None
See application file for complete search history.

(56) References Cited

U.S. PATENT DOCUMENTS

| | | | | |
|---|---|---|---|---|
| 4,691,206 A | * | 9/1987 | Shapter | H01Q 13/18 343/700 MS |
| 5,682,167 A | * | 10/1997 | Mullen | H01Q 9/0407 343/700 MS |

(Continued)

OTHER PUBLICATIONS

Chung Kuo, Hsin-Chia Lu, Po-An Lin, Chen-Fang Tai, Yue-Ming Hsin and Huei Wang, "A fully SiP integrated V-band butler matrix end-fire beam switching transmitter using flip chip assembled CMOS chips on LTCC," IEEE Transactions on Microwave Theory and Techniques, vol. 60, No. 5, 1424-1436, May 2012.

*Primary Examiner* — Howard Williams
(74) *Attorney, Agent, or Firm* — Hauptman Ham, LLP

(57) ABSTRACT

An antenna structure includes a ground plane in a first metal layer of an integrated circuit (IC) package, a patch in a second metal layer of the IC package, a cavity structure between the ground plane and the patch, and a high-k dielectric layer between the ground plane and the patch.

20 Claims, 8 Drawing Sheets

(56) References Cited

U.S. PATENT DOCUMENTS

| | | | |
|---|---|---|---|
| 7,460,072 B1 * | 12/2008 | Goldberger | H01Q 1/38 |
| | | | 343/700 MS |
| 8,754,818 B2 | 6/2014 | Yen et al. | |
| 9,252,491 B2 | 2/2016 | Liu et al. | |
| 9,305,888 B2 | 4/2016 | Chen | |
| 9,431,714 B2 | 8/2016 | Yen | |
| 10,122,091 B2 * | 11/2018 | Lee | H01Q 9/045 |
| 2005/0242997 A1 * | 11/2005 | Dunn | H05K 1/162 |
| | | | 343/700 MS |
| 2011/0063174 A1 * | 3/2011 | Cho | H01Q 9/0457 |
| | | | 343/702 |
| 2016/0218072 A1 | 7/2016 | Liao et al. | |

\* cited by examiner

PATCH ANTENNA STRUCTURES AND METHODS

BACKGROUND

Integrated circuits (IC) are often used for wireless applications that include radio frequency (RF) devices and RF antennae. Frequency-related characteristics of an RF antenna are a function of the antenna's geometry and the physical properties of the antenna's components.

Antenna performance is sometimes gauged by an S11 parameter (also referred to as the reflection coefficient or power loss of the antenna), which indicates the amount of power returned by the antenna at an antenna input. Because an antenna typically has low internal losses, increased return losses usually correspond to increased radiation power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
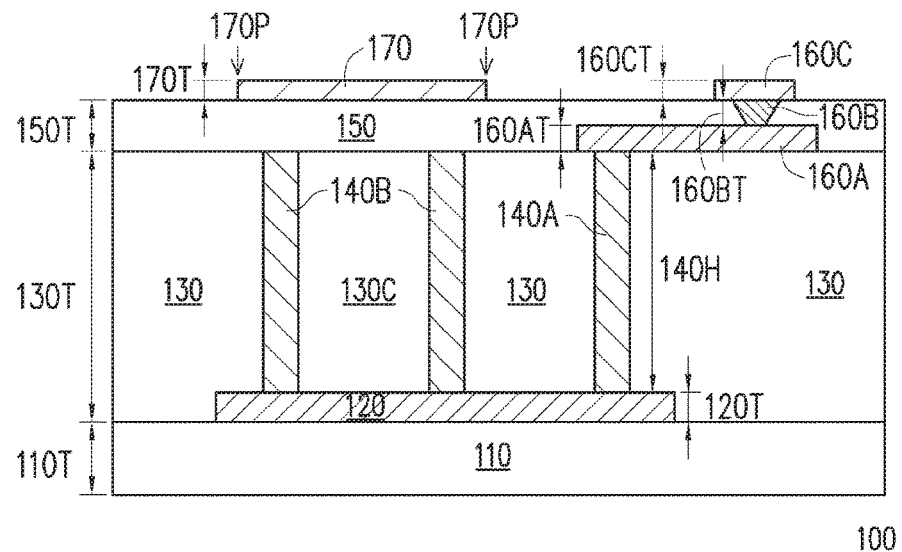
FIGS. 1A and 1B are diagrams of an antenna structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an antenna structure includes a ground plane in a first metal layer of an IC package, a patch in a second metal layer of the IC package, and a high-k dielectric layer between the ground plane and the patch. In some embodiments, the antenna structure includes a cavity between the ground plane and the patch. Compared to antenna structures that do not include a high-k dielectric layer and, if present, a cavity, the various embodiments provide improved antenna performance with reduced patch sizes.

Details regarding an IC package and an IC package manufacturing flow are found, e.g., in U.S. Pat. No. 9,711,465, granted Jul. 18, 2017, the entirety of which is hereby incorporated by reference.

Figure 1B:
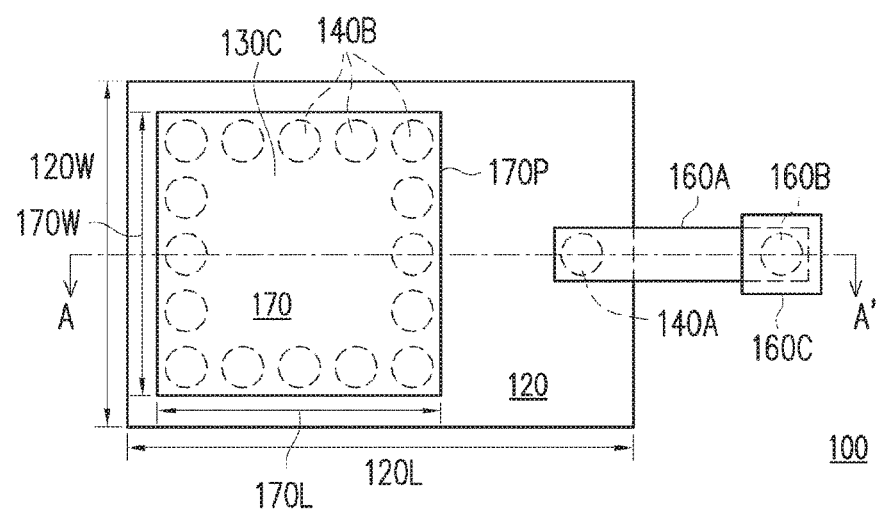

FIGS. 1A and 1B are diagrams of an antenna structure 100, in accordance with some embodiments. FIG. 1A is a diagram based on a cross-sectional view of antenna structure 100, and FIG. 1B is a diagram based on a plan view of antenna structure 100. The cross-sectional plane depicted in FIG. 1A is indicated by line A-A' in FIG. 1B.

Antenna structure 100 includes an insulation layer 110, a ground plane 120 overlying insulation layer 110, an insulation layer 130 overlying insulation layer 110 and ground plane 120, through-insulator vias (TIVs) 140A and 140B in insulation layer 130, a high-k dielectric layer 150 overlying insulation layer 130, signal paths 160A and 160B in high-k dielectric layer 150, a signal path 160C overlying signal path 160B, and a patch 170 overlying high-k dielectric layer 150 and ground plane 120.

Antenna structure 100 is a component of an IC package. In some embodiments, antenna structure 100 is a component of a 2.5 D IC package. In some embodiments, antenna structure 100 is a component of a 3 D IC package. In some embodiments, antenna structure 100 is a component of an integrated fan-out (InFO) package. In some embodiments, antenna structure 100 is one antenna structure of a plurality of antenna structures in an IC package.

Insulation layer 110 is a package layer including one or more materials capable of providing physical separation and high electrical resistance between one or more overlying package layers and one or more underlying package layers or an ambient environment. In some embodiments, insulation layer 110 includes a polymer or another material suitable for physically and electrically isolating one or more overlying package layers. In some embodiments, insulation layer 110 includes polybenzoxazole (PBO) or polyimide (PI).

In some embodiments, insulation layer 110 has a thickness 110T ranging from 2 micrometers ($\mu$m) to 20 $\mu$m. In some embodiments, thickness 110T ranges from 4 $\mu$m to 10 $\mu$m. Thickness 110T having smaller values reduces the ability of insulation layer 110 to provide physical and electrical isolation in some instances.

Ground plane 120 is a part of a conduction layer overlying insulation layer 110. In some embodiments, ground plane 120 is a part of a metal redistribution layer of an IC package. In some embodiments, ground plane 120 includes copper. In some embodiments, ground plane 120 includes a seed layer containing copper or a copper alloy. In some embodiments, ground plane 120 includes a diffusion barrier layer containing titanium. In some embodiments, ground plane 120 has a thickness 120T ranging from 3 μm to 20 μm. In some embodiments, thickness 120T ranges from 5 μm to 10 μm. Thickness 120T having smaller values reduces the ability of ground plane 120 to provide electrical conductivity in some instances.

In the embodiments depicted in FIGS. 1A and 1B, ground plane 120 has a rectangular shape. In some embodiments, ground plane 120 has a shape other than rectangular, e.g., circular, oval, or a non-rectangular polygon. In some embodiments, ground plane 120 is one ground plane of a plurality of ground planes.

In some embodiments, ground plane 120 has a length 120L ranging from 2 millimeters (mm) to 10 mm. In some embodiments, length 120L ranges from 3 mm to 7 mm. In some embodiments, ground plane 120 has a width 120W ranging from 1 mm to 5 mm. In some embodiments, width 120W ranges from 2 mm to 3 mm. Length 120L and width 120W having the values discussed above enables antenna structure 100 to have desired frequency-based characteristics such as the frequency-based characteristics discussed below.

Insulation layer 130 is a package layer including one or more materials capable of providing high electrical resistance between one or more overlying package layers and one or more underlying package layers. In some embodiments, insulation layer 130 includes a single layer having a substantially uniform composition. In some embodiments, insulation layer 130 includes multiple portions having compositions that vary between and/or within each portion.

In some embodiments, insulation layer 130 includes a molding compound, such as a resin or an epoxy. In some embodiments, insulation layer 130 includes an epoxy and granular silica. In some embodiments, insulation layer 130 includes one or more materials capable of providing high electrical resistance and mechanical support, and one or more gasses. In some embodiments, insulation layer 130 includes one or more materials capable of providing high electrical resistance and mechanical support, and air from an ambient environment.

In some embodiments, insulation layer 130 has a thickness 130T ranging from 100 μm to 300 μm. In some embodiments, thickness 130T ranges from 125 μm to 260 μm. Thickness 130T having the values discussed above enables insulation layer 130 to provide physical support and electrical isolation in an IC package that includes additional components such as one or more IC dies or interposers in some instances.

TIV 140A is a conductive structure positioned in insulation layer 130 and capable of providing a low electrical resistance path between a layer underlying insulation layer 130, e.g., ground plane 120, and a layer overlying insulation layer 130, e.g., signal path 160A. In some embodiments, TIV 140A is directly connected to ground plane 120. In some embodiments, one or more conductive elements (not shown) electrically connect TIV 140A to ground plane 120.

In some embodiments, TIV 140A is directly connected to signal path 160A. In some embodiments, one or more conductive elements (not shown) electrically connect TIV 140A to signal path 160A.

By being positioned in insulation layer 130 between ground plane 120 and signal path 160A, TIV 140A is configured to provide an electrical connection between ground plane 120 and signal path 160A. In some embodiments, TIV 140A is one TIV of a plurality of TIVs, each of which is configured to provide an electrical connection between ground plane 120 and signal path 160A.

TIVs 140B are one or more conductive structures positioned in insulation layer 130 in a closed arrangement corresponding to a perimeter 170P of patch 170. In the embodiments depicted in FIG. 1B, sixteen TIVs 140B are positioned in a square pattern corresponding to a square delineated by perimeter 170P. In some embodiments, fewer than sixteen TIVs 140B are positioned in a closed arrangement. In some embodiments, greater than sixteen TIVs 140B are positioned in a closed arrangement.

In some embodiments, a plurality of TIVs 140B are positioned in a closed arrangement other than a square, e.g., a rectangle, a circle, an oval, or a non-rectangular polygon. In some embodiments, a singular, continuous TIV 140B in insulation layer 130 has a closed pattern corresponding to perimeter 170P.

In the embodiments depicted in FIGS. 1A and 1B, TIVs 140B are positioned entirely within perimeter 170P, as seen in the plan view representation of FIG. 1B. In some embodiments, one or more TIVs 140B are positioned outside perimeter 170P or partially under patch 170 such that perimeter 170P overlaps the one or more TIVs 140B.

In contrast with TIVs 140A, the one or more TIVs 140B are electrically connected to ground plane 120 and are free of an electrical connection to signal path 160A. In some embodiments, the one or more TIVs 140B are directly connected to ground plane 120. In some embodiments, one or more conductive elements (not shown) electrically connect the one or more TIVs 140B to ground plane 120.

By being positioned in insulation layer 130 in an arrangement corresponding to perimeter 170P and being electrically connected to ground plane 120, the one or more TIVs 140B and a portion of ground plane 120 delineated by TIVs 140B are configured to form a cavity structure 130C underlying patch 170.

Cavity structure 130C includes a volume defined by ground plane 120 and TIVs 140B within which, in operation, a signal oscillates between ground plane 120 and patch 170. In some embodiments, cavity structure 130C includes a volume that corresponds to a resonance frequency of antenna structure 100. In the embodiments depicted in FIGS. 1A and 1B, cavity structure 130C is an insulator-filled cavity structure. In some embodiments, cavity structure 130C is an air-filled or gas-filled cavity structure.

In the embodiments depicted in FIGS. 1A and 1B, patch 170 overlies an entirety of cavity structure 130C. In some embodiments, one or more portions of cavity structure 130C extend beyond perimeter 170P such that patch 170 overlies less than an entirety of cavity structure 130C.

In some embodiments, at least one of TIV 140A or the one or more TIVs 140B includes a metal. In some embodiments, at least one of TIV 140A or the one or more TIVs 140B includes copper. In some embodiments, at least one of TIV 140A or the one or more TIVs 140B includes a seed layer containing copper or a copper alloy. In some embodiments, at least one of TIV 140A or the one or more TIVs 140B includes a diffusion barrier layer containing titanium.

In some embodiments, each of TIV 140A and the one or more TIVs 140B has a height 140H ranging from 100 μm to 300 μm. In some embodiments, each of TIV 140A and the one or more TIVs 140B have height 140H ranging from 120 μm to 250 μm. Height 140H having the values discussed above enables TIV 140A and the one or more TIVs 140B to provide electrical conductivity consistent with one or more IC package formation processes and corresponds to dimensions of one or more additional IC package components such as one or more IC dies or interposers in some instances.

In some embodiments, thickness 130T is substantially equal to a sum of thickness 110T and height 140H.

High-k dielectric layer 150 is a layer including one or more materials having a dielectric constant greater than that of silicon dioxide, 3.9. High-k dielectric layer 150 is thereby capable of providing high electrical resistance between one or more overlying package layers and one or more underlying package layers.

In some embodiments, high-k dielectric layer 150 includes a single layer having a substantially uniform composition. In some embodiments, high-k dielectric layer 150 includes multiple layers having compositions that vary between and/or within each layer.

In some embodiments, high-k dielectric layer 150 includes one or more materials having one or more dielectric constants ranging from 5 to 2000. In some embodiments, high-k dielectric layer 150 includes one or more materials having one or more dielectric constants ranging from 7 to 1500. In various embodiments, high-k dielectric layer 150 includes one or more of titanium dioxide, strontium titanate, barium titanate, barium strontium titanate, or lead zirconate titanate.

In some embodiments, high-k dielectric layer 150 has a thickness 150T ranging from 0.5 μm to 10 μm. In some embodiments, thickness 150T ranges from 1 μm to 4 μm. Thickness 150T having smaller values reduces the ability of high-k dielectric layer 150 to provide electrical isolation in some instances. Thickness 150T having greater values increases production time and costs in some instances.

Signal path 160A is a part of a conduction layer overlying insulation layer 130 and TIV 140A. In some embodiments, signal path 160A is a part of a metal redistribution layer of an IC package. In some embodiments, signal path 160A includes copper. In some embodiments, signal path 160A includes a seed layer containing copper or a copper alloy. In some embodiments, signal path 160A includes a diffusion barrier layer containing titanium. In some embodiments, signal path 160A has a thickness 160AT ranging from 3 μm to 20 μm. In some embodiments, signal path 160A has thickness 160AT ranging from 5 μm to 10 μm. Thickness 160AT having smaller values reduces the ability of signal path 160A to provide electrical conductivity in some instances.

By being positioned overlying insulation layer 130 and TIV 140A, signal path 160A is configured to provide an electrical connection between TIV 140A and signal path 160B.

In the embodiments depicted in FIG. 1A, high-k dielectric layer 150 overlies insulation layer 130, including cavity structure 130C, the one or more TIVs 140B, and signal path 160A. In some embodiments, high-k dielectric layer 150 overlies cavity structure 130C and the one or more TIVs 140B, and another dielectric layer (not shown) overlies signal path 160A. In some embodiments, high-k dielectric layer 150 overlies cavity structure 130C, and one or more additional dielectric layers (not shown) overlie the one or more TIVs 140B and signal path 160A.

In the embodiments depicted in FIG. 1A, high-k dielectric layer 150 contacts insulation layer 130, the one or more TIVs 140B, and signal path 160A by directly overlying insulation layer 130 and signal path 160A. In some embodiments, high-k dielectric layer 150 overlies one or more additional layers (not shown) that contact insulation layer 130, the one or more TIVs 140B, and/or signal path 160A, and high-k dielectric layer 150 does not directly contact the one or more of insulation layer 130, the one or more TIVs 140B, or signal path 160A.

Signal path 160B is a conductive structure in high-k dielectric layer 150 that overlies and contacts signal path 160A, thereby being configured to provide an electrical connection between signal path 160A and signal path 160C. In some embodiments, signal path 160B is configured to provide an electrical connection between signal path 160A and signal path 160C by being positioned in a dielectric layer (not shown) other than high-k dielectric layer 150.

In some embodiments, signal path 160B includes a via structure. In some embodiments, signal path 160B includes a seed layer and/or a diffusion barrier layer. In some embodiments, signal path 160B includes one or more metals such as copper, a copper alloy, aluminum, tungsten, and/or titanium.

In some embodiments, signal path 160B has a thickness 160BT ranging from 0.5 μm to 10 μm. In some embodiments, signal path 160B has a thickness 160BT ranging from 1 μm to 4 μm. In some embodiments, signal path 160B has a thickness 160BT equal to thickness 150T. Thickness 160BT having smaller values reduces the ability of signal path 160B to provide electrical conductivity in some instances.

Signal path 160C is a part of part of a conduction layer that overlies and contacts signal path 160B, thereby being configured to provide an electrical connection between signal path 160B and an overlying layer (not shown). In some embodiments, signal path 160C overlies high-k dielectric layer 150. In some embodiments, signal path 160C is a part of a metal redistribution layer of an IC package. In some embodiments, signal path 160C includes copper. In some embodiments, signal path 160C includes a seed layer containing copper or a copper alloy. In some embodiments, signal path 160C includes a diffusion barrier layer containing titanium.

In some embodiments, signal path 160C has a thickness 160CT ranging from 3 μm to 20 μm. In some embodiments, signal path 160C has thickness 160CT ranging from 5 μm to 10 μm. Thickness 160CT having smaller values reduces the ability of signal path 160C to provide electrical conductivity in some instances.

Patch 170 is part of a conduction layer that overlies high-k dielectric layer 150 and ground plane 120. In some embodiments, patch 170 is a part of a metal redistribution layer of an IC package. In some embodiments, patch 170 and signal path 160C are separate parts of a same metal redistribution layer of an IC package. In some embodiments, patch 170 includes copper. In some embodiments, patch 170 includes a seed layer containing copper or a copper alloy. In some embodiments, patch 170 includes a diffusion barrier layer containing titanium.

In some embodiments, patch 170 has a thickness 170T ranging from 3 μm to 20 μm. In some embodiments, thickness 170T ranges from 5 μm to 10 μm. Thickness 170T having smaller values reduces the ability of patch 170 to provide electrical conductivity in some instances.

In the embodiments depicted in FIGS. 1A and 1B, an entirety of patch 170 overlies each of high-k dielectric layer 150 and ground plane 120. In some embodiments, a portion of patch 170 extends beyond one or more boundaries of one or both of high-k dielectric layer 150 or ground plane 120 such that less than an entirety of patch 170 overlies one or both of high-k dielectric layer 150 or ground plane 120.

In the embodiments depicted in FIGS. 1A and 1B, patch 170 has a rectangular shape. In some embodiments, patch 170 has a shape other than rectangular, e.g., circular, oval, or a non-rectangular polygon. In some embodiments, patch 170 is one patch of a plurality of patches.

In some embodiments, patch 170 has a length 170L ranging from 0.5 mm to 1.5 mm. In some embodiments, length 170L ranges from 0.9 mm to 1.0 mm. In some embodiments, patch 170 has a width 170W ranging from 0.5 mm to 1.5 mm. In some embodiments, width 170W ranges from 0.9 mm to 1.0 mm. Length 170L and width 170W having the values discussed above enables antenna structure 200 to have desired frequency-based characteristics such as the frequency-based characteristics discussed below.

In operation, antenna structure 100 transmits and/or receives a signal by oscillating the signal between ground plane 120 and patch 170. As an approximation, antenna structure 100 has a resonance frequency inversely proportional to the product of one of length 170L or width 170W and the square root of the effective dielectric constant between ground plane 120 and patch 170.

In some embodiments, antenna structure 100 is configured as discussed above so as to be capable of transmitting and/or receiving signals having a frequency ranging from 100 megahertz (MHz) to 120 gigahertz (GHz). In some embodiments, antenna structure 100 is configured as discussed above so as to be capable of transmitting and/or receiving signals having a frequency ranging from 28 GHz to 77 GHz.

By including high-k dielectric layer 150, antenna structure 100 has an effective dielectric constant between ground plane 120 and patch 170 larger than that of a patch antenna structure that does not include a high-k dielectric layer. For a given resonance frequency, antenna structure 100 has smaller patch dimensions than a patch antenna structure that does not include a high-k dielectric layer.

Also, by including high-k dielectric layer 150, antenna structure 100 has reduced capacitive coupling between patch 170 and ground plane 120 compared to patch antenna structures that do not include a high-k dielectric layer. With reduced capacitive coupling, antenna structure 100 has improved return loss compared to patch antenna structures that do not include a high-k dielectric layer.

Cavity structure 130C including ground plane 120 and TIVs 140B further improves return loss in antenna structure 100 compared to patch antenna structures that do not include a cavity structure. Cavity structure 130C is also capable of reducing coupling between antenna structure 100 and nearby circuits compared to patch antenna structures that do not include a cavity structure, thereby reducing signal noise.

Figure 2A:
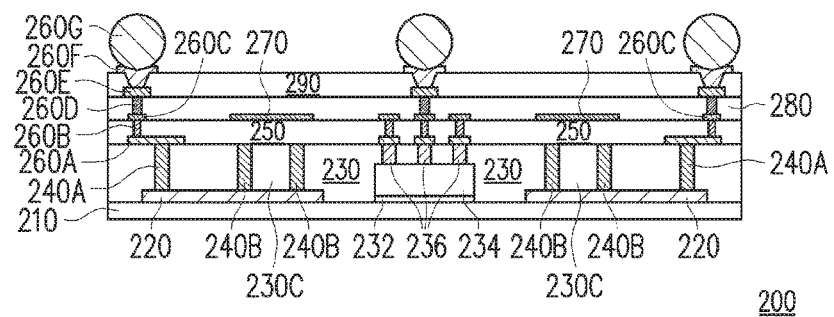
FIGS. 2A and 2B are diagrams of an antenna structure, in accordance with some embodiments.
Figure 2B:
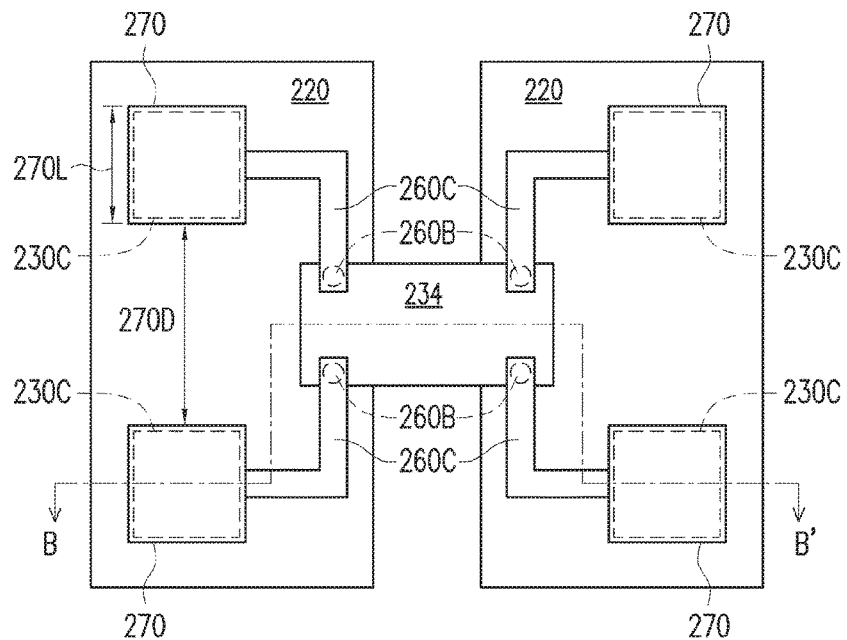

FIGS. 2A and 2B are diagrams of an antenna structure 200, in accordance with some embodiments. FIG. 2A is a diagram based on a cross-sectional view of antenna structure 200, and FIG. 2B is a diagram based on a plan view of antenna structure 200. The cross-sectional contour depicted in FIG. 2A is indicated by line B-B' in FIG. 2B.

Elements of antenna structure 200 that correspond to those of antenna structure 100, discussed above with respect to FIGS. 1A and 1B, have reference designators equal to the corresponding antenna structure 100 reference designators increased by 100. Compared to antenna structure 100, antenna structure 200 includes multiple ground planes 220, multiple cavity structures 230C, multiple patches 270, an RF die 234, and additional interconnect elements as discussed below.

An adhesive layer 232 mechanically couples RF die 234 with an insulation layer 210, and pad structures 236 electrically couple RF die 234 with overlying signal paths 260A, 260B, and 260C. Signal paths 260D overlie signal paths 260C and are positioned in an insulation layer 280 that overlies high-k dielectric layer 250 and patches 270. Signal paths 260E overlie signal paths 260D and are positioned in an insulation layer 290 that overlies insulation layer 280. Under-bump metallizations (UBMs) 260F overlie signal paths 260E, and bumps 260G overlie UBMs 260F.

Antenna structure 200 is a component of an IC package. In some embodiments, antenna structure 200 is a component of a 2.5 D IC package. In some embodiments, antenna structure 200 is a component of a 3 D IC package. In some embodiments, antenna structure 200 is a component of an InFO package. In some embodiments, antenna structure 200 is one antenna structure of a plurality of antenna structures in an IC package.

In the embodiments depicted in FIGS. 2A and 2B, antenna structure 200 includes a single RF die 234. In some embodiments, antenna structure 200 includes one or more RF dies (not shown) in addition to RF die 234.

RF die 234 is a semiconductor die that includes one or more ICs configured to generate and/or receive one or more RF signals on antenna structure 200. In some embodiments, RF die 234 is configured to generate and/or receive an RF signal having a frequency ranging from 100 megahertz (MHz) to 120 gigahertz (GHz). In some embodiments, RF die 234 is configured to generate and/or receive an RF signal having a frequency ranging from 28 GHz to 77 GHz.

Adhesive layer 232 includes an adhesive material capable of maintaining RF die 234 in a stable position relative to insulation layer 210. In various embodiments, adhesive layer 232 includes a die attach film (DAF), a dry film, or a dicing tape.

Pad structures 236 are conductive elements in an insulation layer 230 that overlie RF die 234 and electrically couple one or more contacts on a top surface (not labelled) of RF die 234 with signal path 160A, thereby being configured to provide one or more electrical connections between RF die 234 and signal path 160A. Pad structures 236 include one or a combination of a via structure or a conductive layer. In some embodiments, pad structures 236 include parts of one or more redistribution layers of an IC package. In some embodiments, pad structures 236 include one or more seed layers and/or diffusion barrier layers. In some embodiments, pad structures 236 include one or more metals such as copper, a copper alloy, aluminum, tungsten, and/or titanium.

In the embodiments depicted in FIGS. 2A and 2B, antenna structure 200 includes a single high-k dielectric layer 250 overlying every ground plane 220 and RF die 234. In some embodiments, antenna structure 200 includes a plurality of high-k dielectric layers 250. In some embodiments, antenna structure 200 includes a plurality of high-k dielectric layers 250, each high-k dielectric layer 250 corresponding to a ground plane 220. In some embodiments, antenna structure 200 includes a plurality of high-k dielectric layers 250, each high-k dielectric layer 250 corresponding to a patch 270.

In the embodiments depicted in FIGS. 2A and 2B, high-k dielectric layer 250 overlies signal paths 260A and includes signal paths 260B. In some embodiments, antenna structure 200 includes one or more dielectric layers (not shown) other than high-k dielectric layer 250 that overlie signal paths 260A and include signal paths 260B.

Insulation layer 280 is a package layer including one or more materials capable of providing physical separation and high electrical resistance between one or more overlying package layers and one or more underlying package layers. In some embodiments, insulation layer 280 includes a polymer. In some embodiments, insulation layer 280 includes polybenzoxazole (PBO) or polyimide (PI).

Signal paths 260D are conductive structures in insulation layer 280 that overlie and contact signal paths 260C, thereby being configured to provide electrical connections between signal paths 260C and corresponding signal paths 260E. In some embodiments, signal paths 260D include via structures. In some embodiments, signal paths 260D include a seed layer and/or a diffusion barrier layer. In some embodiments, signal paths 260D include one or more metals such as copper, a copper alloy, aluminum, tungsten, and/or titanium.

Signal paths 260E are parts of a conduction layer that overlie and contact corresponding signal paths 260D, thereby being configured to provide electrical connections between signal paths 260D and corresponding UBMs 260F. In some embodiments, signal paths 260E are parts of a metal redistribution layer of an IC package. In some embodiments, signal paths 260E include copper. In some embodiments, signal paths 260E include a seed layer containing copper or a copper alloy. In some embodiments, signal paths 260E include a diffusion barrier layer containing titanium.

Insulation layer 290 is a package layer including one or more materials capable of providing physical separation and high electrical resistance between one or more overlying package layers and one or more underlying package layers. In some embodiments, insulation layer 290 includes a polymer. In some embodiments, insulation layer 290 includes polybenzoxazole (PBO).

UBMs 260F are conductive structures in and overlying insulation layer 290 that overlie and contact signal paths 260E, thereby being configured to provide electrical connections between signal paths 260E and corresponding bumps 260G. In some embodiments, UBMs 260F include a seed layer and/or a diffusion barrier layer. In some embodiments, UBMs 260F include one or more metals such as copper, a copper alloy, aluminum, tungsten, and/or titanium.

Bumps 260G are conductive structures that overlie and contact UBMs 260F, thereby being configured to provide electrical connections between UBMs 260F and corresponding external conductive elements (not shown). In some embodiments, bumps 260G include lead. In some embodiments, bumps 260G include lead-free materials such as tin, nickel, gold, silver, copper, or other materials suitable for providing electrical connections to external conductive elements.

In some embodiments, bumps 260G have substantially spherical shapes. In some embodiments, bumps 260G are controlled collapse chip connection (C4) bumps, ball grid array bumps, or microbumps.

In the embodiments depicted in FIGS. 2A and 2B, antenna structure 200 includes two ground planes 220. In some embodiments, antenna structure 200 includes a single ground plane 220. In some embodiments, antenna structure 200 includes greater than two ground planes 220.

In the embodiments depicted in FIGS. 2A and 2B, antenna structure 200 includes four patches 270 and four corresponding cavity structures 230C. In some embodiments, antenna structure 200 includes fewer than four patches 270 and four corresponding cavity structures 230C. In some embodiments, antenna structure 200 includes greater than four patches 270 and four corresponding cavity structures 230C.

In the embodiments depicted in FIGS. 2A and 2B, a single ground plane 220 corresponds to two patches 270, and each patch 270 corresponds to a cavity structure 230C that includes a subset of TIVs 240B and a corresponding portion of the single ground plane. In some embodiments, a single ground plane 220 corresponds to a single patch 270 and a single cavity structure 230C that includes a subset of TIVs 240B and a corresponding portion of the single ground plane. In some embodiments, a single ground plane 220 corresponds to greater than two patches 270, and each patch 270 corresponds to a cavity structure 230C that includes a subset of TIVs 240B and a corresponding portion of the single ground plane.

In the embodiments depicted in FIGS. 2A and 2B, each patch 270 is electrically connected to a corresponding pad structure by a signal path 260C in a same layer as the patch 270. In some embodiments, a patch 270 is electrically connected to a corresponding pad structure by a signal path that includes one or more conductive elements (not shown) in addition to or instead of signal path 260C.

In the embodiments depicted in FIGS. 2A and 2B, each patch 270 is electrically connected to a corresponding pad structure by a signal path 260C at an edge of the patch 270. In some embodiments, a patch 270 is electrically connected to a corresponding pad structure by a signal path that includes one or more conductive elements (not shown) that contact the patch 270 at a location other than an edge of the patch 270.

In the embodiments depicted in FIGS. 2A and 2B, each patch 270 overlies a corresponding ground plane 220 such that, in operation, a signal transmitted or received on the patch has maximum power or sensitivity, respectively, in a direction normal to the patch 270 and away from the corresponding ground plane 220, thereby having a first directivity. In some embodiments, antenna structure 200 includes a first patch 270 overlying a first ground plane 220 having a first directivity and a second ground plane 220 that overlies one or more patches 270, thereby defining a second directivity opposite the first directivity.

Antenna structure 200 is configured as depicted in FIGS. 2A and 2B and discussed above such that, in operation, antenna structure 200 receives and/or outputs one or more voltages and/or signals on bumps 260G, and communicates the one or more voltages and/or signals between one or more of bumps 260G, RF die 234, patches 270, and ground planes 220, the one or more voltages and/or signals being communicated along signal paths 260A-260F and TIVs 240A.

In operation, antenna structure 200 transmits and/or receives a radiated signal by oscillating the signal between a given ground plane 220 and one or more corresponding patches 270, each having a length 270L. As an approximation, antenna structure 200 has a resonance frequency inversely proportional to the product of length 270L and the square root of the effective dielectric constant between the given ground plane 220 and the corresponding patches 270.

In some embodiments, a patch 270 has a length 270L ranging from 0.5 mm to 1.5 mm. In some embodiments, length 270L ranges from 0.9 mm to 1.0 mm. Length 270L having the values discussed above enables antenna structure 200 to have desired frequency-based characteristics such as the frequency-based characteristics discussed below.

Antenna structure 200 is configured as discussed above to have a resonance frequency that matches a frequency at which RF die 234 is configured to operate. In some embodiments, antenna structure 200 is configured as discussed above so as to be capable of transmitting and/or receiving signals having a frequency ranging from 100 megahertz (MHz) to 120 gigahertz (GHz). In some embodiments, antenna structure 200 is configured as discussed above so as to be capable of transmitting and/or receiving signals having a frequency ranging from 28 GHz to 77 GHz.

Patches 270 corresponding to a single ground plane 220 are separated by a distance 270D. In some embodiments, distance 270D is substantially equal to half a free-space wavelength corresponding to a resonance frequency of antenna structure 200.

In some embodiments, patches 270 are separated by distance 270D ranging from 1.0 mm to 4.0 mm. In some embodiments, distance 270D ranges from 2.0 mm to 3.0 mm. Distance 270D having the values discussed above enables antenna structure 200 to have desired frequency-based characteristics such as the frequency-based characteristics discussed above.

By including high-k dielectric layer 250, antenna structure 200 has an effective dielectric constant between ground planes 220 and patches 270 larger than that of a patch antenna structure that does not include a high-k dielectric layer. For a given resonance frequency, antenna structure 200 has smaller patch dimensions than a patch antenna structure that does not include a high-k dielectric layer.

Also, by including high-k dielectric layer 250, antenna structure 200 has reduced capacitive coupling between patches 270 and ground planes 220 compared to patch antenna structures that do not include a high-k dielectric layer. With reduced capacitive coupling, antenna structure 200 has improved return loss compared to patch antenna structures that do not include a high-k dielectric layer.

Cavity structures 230C including ground planes 220 and TIVs 240B further improve return loss in antenna structure 200 compared to patch antenna structures that do not include cavity structures. Cavity structures 230C are also capable of reducing coupling between antenna structure 200 and nearby circuits compared to patch antenna structures that do not include a cavity structure, thereby reducing signal noise.

By including RF die 234 integrated with high-k dielectric layer 250, ground planes 220, cavity structures 230C, and patches 270 in a single package structure, antenna structure 200 is smaller and less costly to manufacture than antenna structures that do not include an RF die integrated with a high-k dielectric layer, ground planes, cavity structures, and patches.

Figure 3:
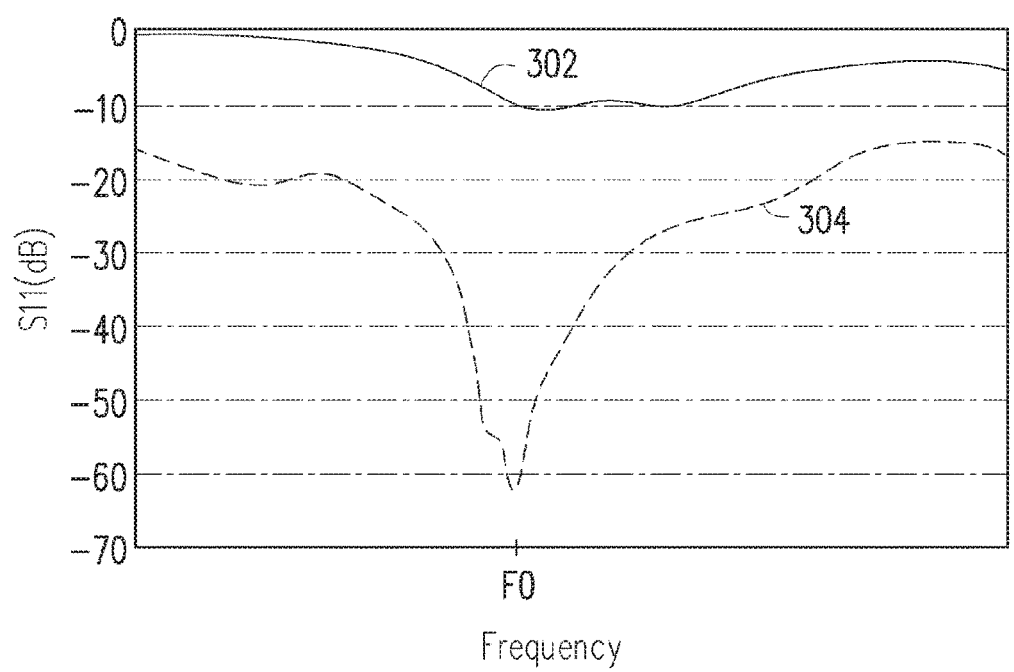
FIG. 3 is a plot of a parameter of an antenna structure, in accordance with some embodiments.

FIG. 3 is a plot of an S11 parameter of an antenna structure, in accordance with some embodiments. FIG. 3 depicts values of the S11 parameter (also referred to as the reflection coefficient or power loss of the antenna) along the y-axis, and frequency along the x-axis. S11 values are depicted on a scale ranging from 0 decibels (dB) to −70 dB. Each of curves 302 and 304 depicts S11 parameter values as a function of signal frequency and is based on a simulation of a patch antenna including a cavity structure.

Curve 302 depicts an S11 frequency relationship for an antenna structure having a patch and ground plane separated by an insulator having a dielectric constant of 3.0, and curve 304 depicts an S11 frequency relationship for an antenna structure having a patch and ground plane separated by an insulator having a dielectric constant of 83.

In some embodiments, curve 304 is based on antenna structure 100 discussed above with respect to FIGS. 1A and 1B. In some embodiments, curve 304 is based on antenna structure 200 discussed above with respect to FIGS. 2A and 2B.

Curve 304 has a point F0 that represents a resonance frequency of the antenna structure. As depicted in FIG. 3, the S11 value of curve 304 at point F0 is significantly below the S11 value of curve 302 at the same frequency, illustrating the improved return loss based on a dielectric constant of 83 compared to the return loss based on a dielectric constant of 3.0.

In the example plot depicted in FIG. 3, point F0 corresponds to an S11 parameter value between −60 dB and −65 dB. In some embodiments, point F0 corresponds to an S11 parameter value above −60 dB. In some embodiments, point F0 corresponds to an S11 parameter value below −65 dB.

In some embodiments, point F0 corresponds to a resonance frequency ranging from 100 MHz to 120 GHz. In some embodiments, point F0 corresponds to a resonance frequency ranging from 28 GHz to 77 GHz. In some embodiments, point F0 corresponds to a resonance frequency equal to about 77 GHz.

Figure 4:
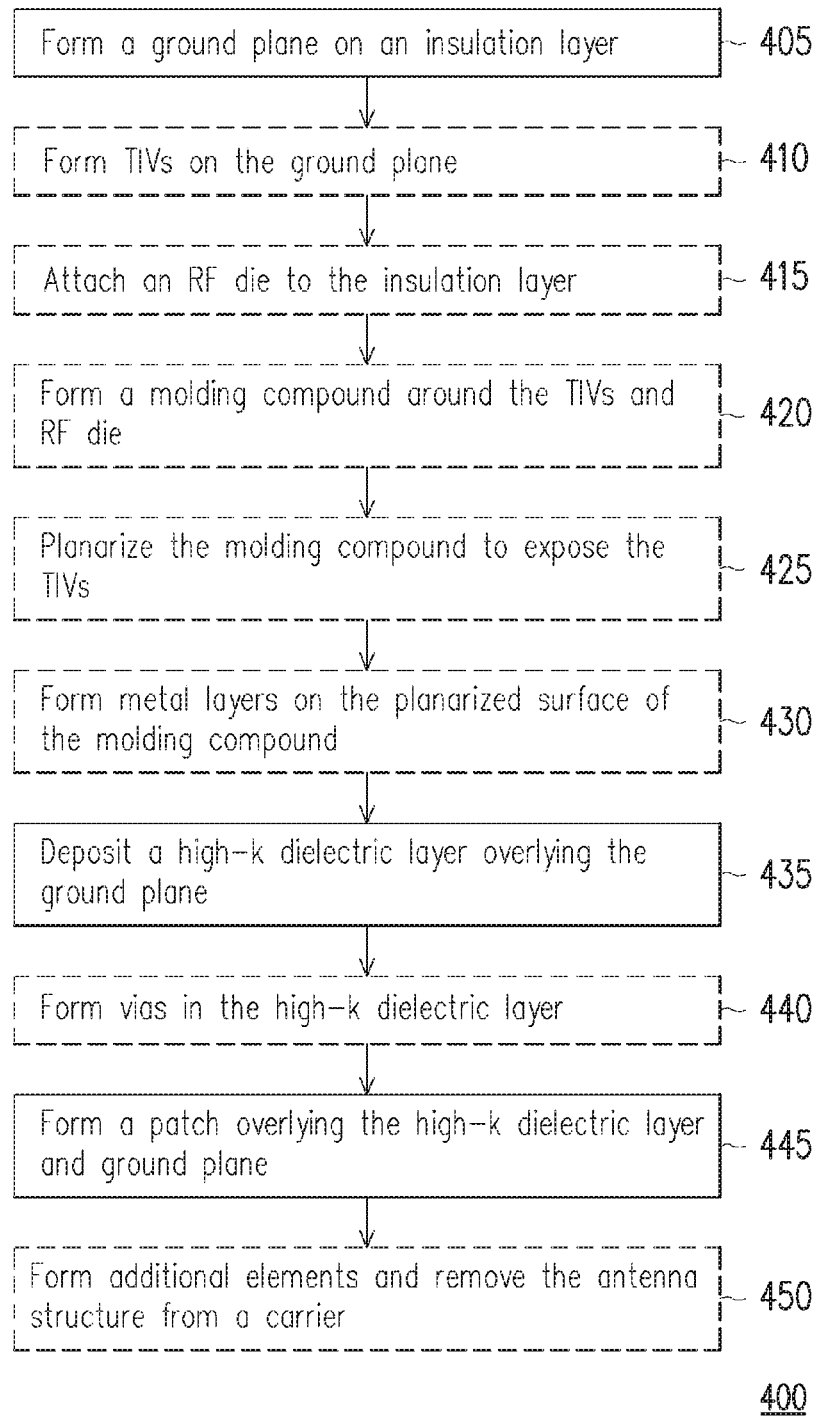
FIG. 4 is a flowchart of a method of forming an antenna structure, in accordance with some embodiments.

FIG. 4 is a flowchart of a method 400 of forming an antenna structure, e.g., antenna structure 100 (FIGS. 1A and 1B) or antenna structure 200 (FIGS. 2A and 2B), in accordance with one or more embodiments. FIGS. 5A-5J are diagrams of an antenna structure 500 at various manufacturing stages corresponding to the operations of method 400, in accordance with some embodiments. Method 400 is operable to form antenna structure 100, discussed above with respect to FIGS. 1A and 1B, or antenna structure 200, discussed above with respect to FIGS. 2A and 2B, and antenna structure 500 is usable as antenna structure 200, in some embodiments.

The sequence in which the operations of method 400 are depicted in FIG. 4 is for illustration only; the operations of method 400 are capable of being executed in sequences that differ from that depicted in FIG. 4. In some embodiments, operations in addition to those depicted in FIG. 4 are performed before, between, and/or after the operations depicted in FIG. 4.

In some embodiments, the operations of method 400 are a subset of operations of a method of forming an IC package. In some embodiments, the operations of method 400 are a subset of operations of a method of forming a 2.5 D IC package. In some embodiments, the operations of method 400 are a subset of operations of a method of forming a 3 D IC package. In some embodiments, the operations of method 400 are a subset of operations of a method of forming an InFO package.

Figure 5A:
FIGS. 5A-5J are diagrams of an antenna structure at various manufacturing stages, in accordance with some embodiments.

At operation 405, ground planes 520 are formed on an insulation layer 510, as depicted in FIG. 5A. Forming ground planes 520 on insulation layer 510 includes forming ground planes 520 on insulation layer 510 overlying a light transfer heat conversion (LTHC) coating 500L on a glass carrier 500C. In some embodiments, forming ground planes 520 includes at least one formation process and at least one etching process. In some embodiments, the at least one formation process includes plating, physical vapor deposition (PVD), chemical vapor deposition (CVD), atomic layer deposition (ALD) or another suitable formation process. In some embodiments, the at least one etching process includes a photolithography process. In some embodiments, the at least one etching process includes a wet etching process or a dry etching process. In some embodiments, forming ground planes 520 on insulation layer 510 includes forming ground planes 520 on insulation layer 510 overlying one or more support layers (not shown) other than LTHC coating 500L and/or glass carrier 500C.

In some embodiments, forming ground planes 520 on insulation layer 510 includes forming ground planes 520 on insulation layer 510 including a polymer. In some embodiments, forming ground planes 520 on insulation layer 510 includes forming ground planes 520 on insulation layer 510 including polybenzoxazole (PBO) or polyimide (PI).

In some embodiments, forming ground planes 520 on insulation layer 510 includes forming ground plane 120 on insulation layer 110, discussed above with respect to antenna structure 100 and FIGS. 1A and 1B. In some embodiments, forming ground planes 520 on insulation layer 510 includes forming ground planes 220 on insulation layer 210, discussed above with respect to antenna structure 200 and FIGS. 2A and 2B.

In some embodiments, forming ground planes 520 is part of depositing a metal redistribution layer of an IC package. In some embodiments, forming ground planes 520 includes depositing a metal such as copper. In some embodiments, forming ground planes 520 includes depositing a seed layer containing copper or a copper alloy. In some embodiments, forming ground planes 520 includes forming a diffusion barrier layer containing titanium.

In some embodiments, forming ground planes 520 includes depositing one or more materials through a patterned photoresist layer (not shown) that is then removed. In some embodiments, forming ground planes 520 includes performing one or more deposition processes followed by performing one or more etching processes.

In some embodiments, forming ground planes 520 includes forming ground planes 520 to a thickness (not labelled) ranging from 3 µm to 20 µm. In some embodiments, forming ground planes 520 includes forming ground planes 520 to a thickness ranging from 5 µm to 10 µm. Forming ground planes 520 to the thickness values discussed above enables ground planes 520 to provide electrical conductivity and to be formed by processes consistent with one or more other IC package formation processes, thereby avoiding additional processes that increase production costs in some instances.

Figure 5B:
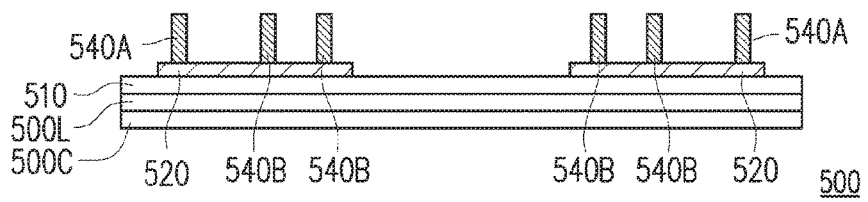

At operation 410, in some embodiments, TIVs 540A and 540B are formed on ground planes 520, as depicted in FIG. 5B. In some embodiments, forming TIVs 540A and 540B includes forming TIVs 140A and 140B, respectively, discussed above with respect to antenna structure 100 and FIGS. 1A and 1B. In some embodiments, forming TIVs 540A and 540B includes forming TIVs 240A and 240B, respectively, discussed above with respect to antenna structure 200 and FIGS. 2A and 2B.

In some embodiments, forming TIVs 540A and 540B includes depositing a mask material, e.g., a hard mask, defining openings in the mask material and filling the openings with a conductive material. The mask material is then removed, e.g., by an ashing process, an etching process or another suitable material removal process. In some embodiments, forming TIVs 540A and 540B includes depositing a metal such as copper. In some embodiments, forming TIVs 540A and 540B includes depositing a seed layer containing copper or a copper alloy. In some embodiments, forming TIVs 540A and 540B includes forming a diffusion barrier layer containing titanium.

In some embodiments, forming TIVs 540A and 540B includes depositing one or more materials through a patterned photoresist layer (not shown) that is then removed. In some embodiments, forming TIVs 540A and 540B includes performing one or more deposition processes followed by one or more etching processes.

In some embodiments, forming TIVs 540A and 540B includes forming TIVs 540A and 540B to a height (not labelled) ranging from 100 µm to 300 µm. In some embodiments, forming TIVs 540A and 540B includes forming TIVs 540A and 540B to a height ranging from 120 µm to 250 µm. Forming TIVs 540A and 540B to the height values discussed above enables TIVs 540A and 540B to provide electrical conductivity and to be formed by processes consistent with one or more other IC package formation processes, thereby avoiding additional processes that increase production costs in some instances.

In some embodiments, forming TIVs 540A includes forming TIVs 540A as cylinders. In some embodiments, forming TIVs 540A includes forming TIVs 540A as pillars having non-circular cross-sectional shapes such as ovals, rectangles, or other polygons.

In some embodiments, forming TIVs 540B includes forming TIVs 540B as cylinders. In some embodiments, forming TIVs 540B includes forming TIVs 540B as pillars having non-circular cross-sectional shapes such as ovals, rectangles, or other polygons. In some embodiments, at least one TIV 540B has a different shape from at least another TIV 540B. In some embodiments, at least one TIV 540A has a different shape from at least one TIV 540B.

In some embodiments, forming TIVs 540B includes forming pluralities of cylinders or pillars, each plurality of cylinders or pillars being arranged in a closed pattern on a corresponding ground plane 520. In some embodiments, forming TIVs 540B includes forming pluralities of wall-like structures, each plurality of wall-like structures being arranged in a closed pattern on a corresponding ground plane 520. In some embodiments, forming TIVs 540B includes forming wall-like structures, each wall-like structure forming an enclosure on a corresponding ground plane 520.

Figure 5C:
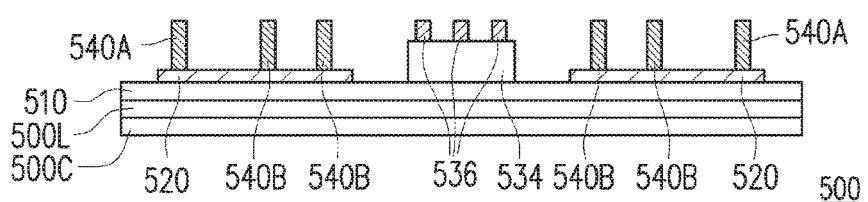

At operation 415, in some embodiments, an RF die 534 is attached to insulation layer 510, as depicted in FIG. 5C. In some embodiments, attaching RF die 534 includes attaching RF die 234, discussed above with respect to antenna structure 200 and FIGS. 2A and 2B.

In some embodiments, attaching RF die 534 to insulation layer 510 includes attaching RF die 534 to insulation layer 510 with a DAF (not shown). In some embodiments, attaching RF die 534 to insulation layer 510 includes attaching RF die 534 to insulation layer 510 with adhesion layer 232, discussed above with respect to antenna structure 200 and FIGS. 2A and 2B. In some embodiments, attaching RF die 534 includes attaching RF die 534 by a bonding process, e.g., fusion bonding, eutectic bonding or another suitable bonding process.

Attaching RF die 534 includes forming pad structures 536. In some embodiments, forming pad structures 536 includes forming pad structures 236, discussed above with respect to antenna structure 200 and FIGS. 2A and 2B.

Forming pad structures 536 includes one or a combination of forming via structures or forming conductive layers. In some embodiments, forming pad structures 536 includes depositing a mask material, e.g., a hard mask, defining openings in the mask material and filling the openings with a conductive material. The mask material is then removed, e.g., by an ashing process, an etching process or another suitable material removal process. In some embodiments, forming pad structures 536 include forming parts of one or more redistribution layers of an IC package. In some embodiments, forming pad structures 536 includes forming one or more seed layers and/or diffusion barrier layers. In some embodiments, forming pad structures 536 includes depositing one or more metals such as copper, a copper alloy, aluminum, tungsten, and/or titanium.

In some embodiments, forming pad structures 536 includes forming pad structures 536 to height (not labelled) above insulation layer 510 approximately equal to a height (not labelled) of TIVs 540A and 540B above insulation layer 510.

Figure 5D:
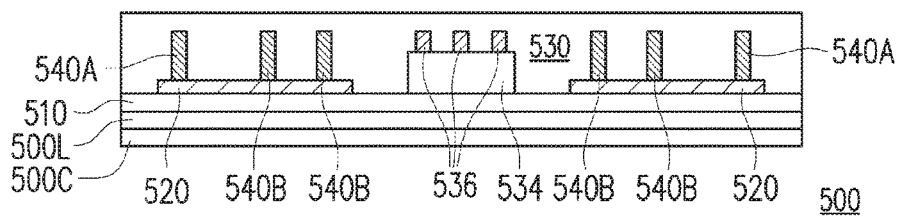

At operation 420, in some embodiments, a molding compound 530 is formed overlying insulation layer 510 and surrounding TIVs 540A and 540B, RF die 534, and pad structures 536, as depicted in FIG. 5D. In some embodiments, forming molding compound 530 includes forming insulation layer 130, discussed above with respect to antenna structure 100 and FIGS. 1A and 1B. In some embodiments, forming molding compound 530 includes forming insulation layer 230, discussed above with respect to antenna structure 200 and FIGS. 2A and 2B.

In some embodiments, forming molding compound 530 comprises PVD, CVD, spin-on coating, printing or another suitable formation process. In some embodiments, forming molding compound 530 comprises injecting at least one gas or air into spaces between TIVs 540A and 540B. In some embodiments, forming molding compound 530 includes forming molding compound 530 in a cavity within TIVs 540B. In some embodiments, forming molding compound 530 includes forming cavity 130C, discussed above with respect to antenna structure 100 and FIGS. 1A and 1B. In some embodiments, forming molding compound 530 includes forming cavity 230C, discussed above with respect to antenna structure 200 and FIGS. 2A and 2B.

In some embodiments, forming molding compound 530 includes forming molding compound 530 outside closed patterns corresponding to TIVs 540B and forming another insulating material within closed patterns corresponding to TIVs 540B.

In some embodiments, forming molding compound 530 includes applying a resin or an epoxy. In some embodiments, forming molding compound 530 includes applying an epoxy and granular silica.

In some embodiments, forming molding compound 530 includes performing a low-temperature curing, or hardening, process. In some embodiments, forming molding compound 530 includes performing a curing process at a temperature equal to or below about 180 degrees Celsius (° C.). By performing a low-temperature curing process, forming molding compound 530 avoids generating stresses based on coefficient of thermal expansion (CTE) mismatches that are otherwise generated by higher-temperature curing processes in some instances. Avoiding CTE-based stresses reduces risks of package damage or compromised reliability from the formation process in some instances.

Figure 5E:
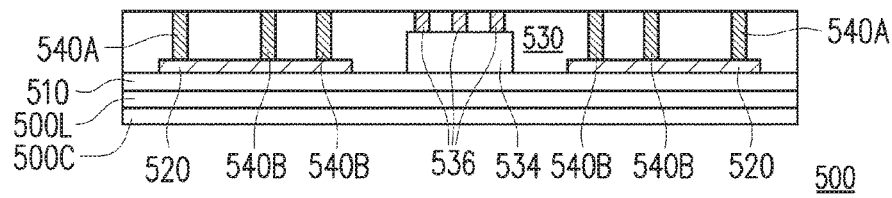

At operation 425, in some embodiments, molding compound 530 is planarized to expose TIVs 540A and 540B and pad structures 536, as depicted in FIG. 5E. In some embodiments, planarizing molding compound 530 includes performing a grinding process, a planarization process, such as chemical mechanical planarization (CMP) or another suitable planarizing process. In some embodiments, planarizing molding compound 530 includes performing a cleaning process after a grinding process.

In some embodiments, planarizing molding compound 530 includes removing a top portion of molding compound 530 so that molding compound 530 has a thickness (not labelled) above insulation layer 510 ranging from 100 µm to 300 µm. In some embodiments, planarizing molding compound 530 includes removing a top portion of molding compound 530 so that molding compound 530 has a thickness ranging from 125 µm to 260 µm.

Figure 5F:
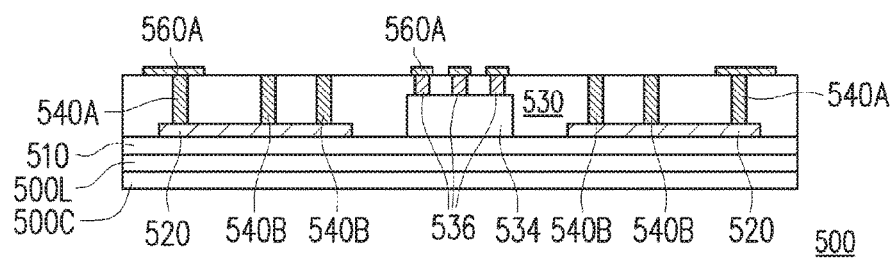

At operation 430, in some embodiments, metal layers 560A are formed on portions of the planarized surface of molding compound 530, TIVs 540A, and pad structures 536, as depicted in FIG. 5F. In some embodiments, forming metal layers 560A includes forming signal path 160A, discussed above with respect to antenna structure 100 and FIGS. 1A and 1B. In some embodiments, forming metal layers 560A includes forming signal paths 260A, discussed above with respect to antenna structure 200 and FIGS. 2A and 2B.

In some embodiments, forming metal layers 560A is part of forming a metal redistribution layer of an IC package. In some embodiments, forming metal layers 560A includes depositing copper. In some embodiments, forming metal layers 560A includes depositing a seed layer containing copper or a copper alloy. In some embodiments, forming metal layers 560A includes depositing a diffusion barrier layer containing titanium.

In some embodiments, forming metal layers 560A includes at least one formation process and at least one etching process. In some embodiments, the at least one formation process includes plating, PVD, CVD, ALD or another suitable formation process. In some embodiments, the at least one etching process includes a photolithography process. In some embodiments, the at least one etching process includes a wet etching process or a dry etching process. In some embodiments, forming metal layers 560A includes performing one or more deposition processes followed by one or more etching processes. In some embodiments, forming metal layers 560A includes depositing one or more materials through a patterned photoresist layer (not shown) that is then removed.

In some embodiments, forming metal layers 560A includes forming metal layers 560A to a thickness (not labelled) ranging from 3 µm to 20 µm. In some embodiments, forming metal layers 560A includes forming metal layers 560A to a thickness ranging from 5 µm to 10 µm. Forming metal layers 560A to the thickness values discussed above enables metal layers 560A to provide electrical conductivity and to be formed by processes consistent with one or more other IC package formation processes, thereby avoiding additional processes that increase production costs in some instances.

In some embodiments where molding compound 530 includes a gas or air, a dummy material is deposited over insulating layer 510 to support metal layers 560A during formation. The dummy material is removed following formation of metal layers 560A. In some embodiments, the dummy material is removed by an etching process, a heating process or another suitable process.

Figure 5G:
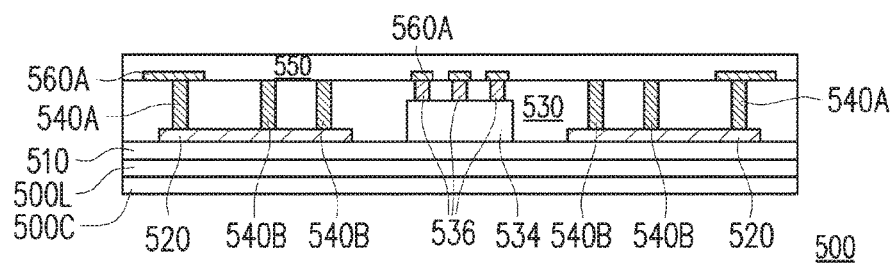

At operation 435, a high-k dielectric layer 550 is deposited overlying ground planes 520 and TIVs 540B, as depicted in FIG. 5G. In some embodiments, depositing high-k dielectric layer 550 includes depositing high-k dielectric layer 150, discussed above with respect to antenna structure 100 and FIGS. 1A and 1B. In some embodiments, depositing high-k dielectric layer 550 includes depositing high-k dielectric layer 250, discussed above with respect to antenna structure 200 and FIGS. 2A and 2B.

In the embodiments depicted in FIG. 5G, depositing high-k dielectric layer 550 includes depositing high-k dielectric layer 550 overlying metal layers 560A and an entirety of molding compound 530. In some embodiments, depositing high-k dielectric layer 550 includes depositing high-k dielectric layer 550 overlying one or more first portions of molding compound 530 and depositing a different insulation layer (not shown) overlying metal layers 560A and one or more second portions of molding compound 530.

Depositing high-k dielectric layer 550 includes depositing one or more materials having a dielectric constant greater than that of silicon dioxide, 3.9. In some embodiments, depositing high-k dielectric layer 550 includes depositing a single layer having a substantially uniform composition. In some embodiments, depositing high-k dielectric layer 550 includes depositing multiple layers having varying compositions.

In some embodiments where molding compound 530 includes a gas or air, a dummy material is deposited over insulating layer 510 to support dielectric layer 550 during formation. The dummy material is removed following formation of dielectric layer 550. In some embodiments, the dummy material is removed by an etching process, a heating process or another suitable process. In some embodiments where molding compound 530 is a gas or air, pitches between adjacent TIVs 540A and 540B are sufficiently small that the dummy material is omitted and dielectric layer 550 is formed directly on TIVs 540A and 540B without the use of a dummy material.

In some embodiments, depositing high-k dielectric layer 550 includes depositing one or more materials having one or more dielectric constants ranging from 5 to 2000. In some embodiments, depositing high-k dielectric layer 550 includes depositing one or more materials having one or more dielectric constants ranging from 7 to 1500. Depositing high-k dielectric layer 550 having the dielectric constant values discussed above enables antenna structure 500 to have desired frequency-based characteristics such as the frequency-based characteristics discussed above with respect to antenna structure 100 and FIGS. 1A and 1B, and with respect to antenna structure 200 and FIGS. 2A and 2B.

In various embodiments, depositing high-k dielectric layer 550 includes depositing one or more of titanium dioxide, strontium titanate, barium titanate, barium strontium titanate, or lead zirconate titanate.

In some embodiments, depositing high-k dielectric layer 550 includes performing a low-temperature deposition process. In some embodiments, depositing high-k dielectric layer 550 includes depositing high-k dielectric layer 550 at a temperature below 200° C. Depositing high-k dielectric layer 550 at the temperature values discussed above avoids generating stresses based on CTE mismatches that otherwise are generated by higher-temperature curing processes in some instances. Avoiding CTE-based stresses reduces risks of package damage or compromised reliability from the deposition process in some instances.

In some embodiments, depositing high-k dielectric layer 550 includes performing a physical vapor deposition (PVD) or chemical vapor deposition (CVD) process. In some embodiments, depositing high-k dielectric layer 550 includes performing a laser chemical vapor deposition (LCVD) process. In some embodiments, depositing high-k dielectric layer 550 includes performing an evaporation process. In some embodiments, depositing high-k dielectric layer 550 includes performing an electron beam evaporation (E-gun) process.

In various embodiments, depositing high-k dielectric layer 550 includes performing an atmospheric pressure chemical vapor deposition (APCVD), a sub-atmospheric pressure chemical vapor deposition (SACVD), a plasma-enhanced chemical vapor deposition (PECVD), a metal organic chemical vapor deposition (MOCVD), or another suitable deposition process.

In some embodiments, depositing high-k dielectric layer 550 includes depositing high-k dielectric layer 550 to have a thickness (not labelled) ranging from 0.5 µm to 10 µm. In some embodiments, depositing high-k dielectric layer 550 includes depositing high-k dielectric layer 550 to have a thickness ranging from 1 µm to 4 µm. Depositing high-k dielectric layer 550 having the thickness values discussed above enables high-k dielectric layer 550 to provide physical and electrical isolation and to be formed by processes consistent with one or more other IC package formation processes, thereby avoiding additional processes that increase production costs in some instances.

Figure 5H:
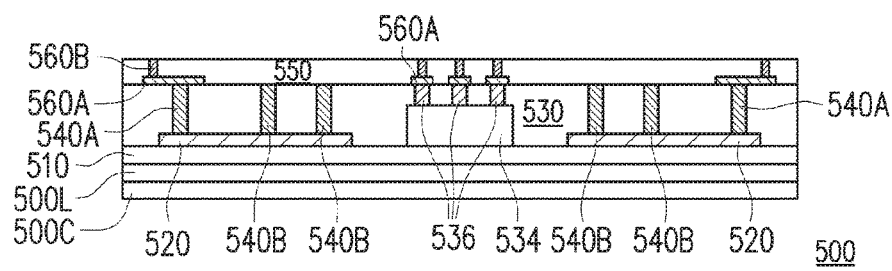

In operation 440, in some embodiments, vias 560B are formed in high-k dielectric layer 550, as depicted in FIG. 5H. In some embodiments, forming vias 560B includes forming signal path 160B, discussed above with respect to antenna structure 100 and FIGS. 1A and 1B. In some embodiments, forming vias 560B includes forming signal paths 260B, discussed above with respect to antenna structure 200 and FIGS. 2A and 2B.

In some embodiments, forming vias 560B includes depositing copper. In some embodiments, forming vias 560B includes depositing a seed layer containing copper or a copper alloy. In some embodiments, forming vias 560B includes depositing a diffusion barrier layer containing titanium.

In some embodiments, forming metal layers 560A includes performing one or more deposition processes followed by one or more etching processes. In some embodiments, forming vias 560B includes depositing one or more patterned photoresist layers (not shown) that are later removed, etching portions of high-k dielectric layer 550, and depositing one or more materials in the etched portions of high-k dielectric layer 550.

Figure 5I:
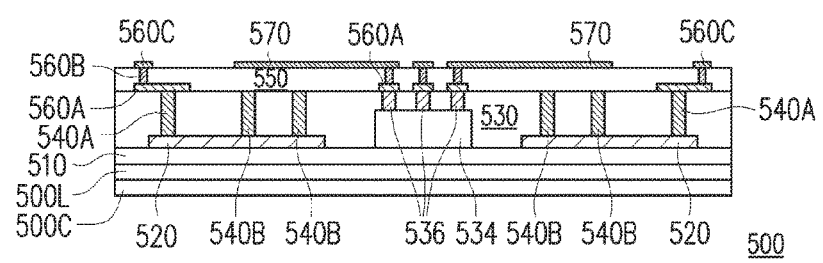

At operation 445, patches 570 are formed overlying high-k dielectric layer 550, TIVs 540B, and ground planes 520, as depicted in FIG. 5I. In some embodiments, forming patches 570 includes forming patch 170, discussed above with respect to antenna structure 100 and FIGS. 1A and 1B. In some embodiments, forming patches 570 includes forming patches 270, discussed above with respect to antenna structure 200 and FIGS. 2A and 2B.

In some embodiments, forming patches 570 includes forming patches 570 having perimeters along closed patterns corresponding to pluralities or closed structures of TIVs 540B, as discussed above. In some embodiments, forming patches 570 includes forming patches 570 having perimeters that surround areas containing pluralities or closed structures of TIVs 540B. In some embodiments, forming patches 570 includes forming patches 570 having perimeters within or partially within areas containing pluralities or closed structures of TIVs 540B.

In the embodiments depicted in FIG. 5I, forming patches 570 includes forming patches 570 having portions overlying pad structures 536, thereby being formed to provide electrical connections between RF die 534 and patches 570. In some embodiments, forming patches 570 includes forming patches 570 that are free from having portions overlying pad structures 536, and one or more additional conductive elements (not shown) are formed to provide electrical connections between RF die 534 and patches 570.

In some embodiments, forming patches 570 includes forming metal layers 560C, as depicted in FIG. 5I. In some embodiments, patches 570 and metal layers 560C are formed as part of forming a metal redistribution layer of an IC package.

In some embodiments, forming patches 570 includes depositing copper. In some embodiments, forming patches 570 includes depositing a seed layer containing copper or a copper alloy. In some embodiments, forming patches 570 includes depositing a diffusion barrier layer containing titanium.

In some embodiments, forming patches 570 includes performing one or more deposition processes followed by one or more etching processes. In some embodiments, forming patches 570 includes depositing one or more materials through a patterned photoresist layer (not shown) that is then removed.

In some embodiments, forming patches 570 includes forming patches 570 to have a thickness (not labelled) ranging from 3 µm to 20 µm. In some embodiments, forming patches 570 includes forming patches 570 to have a thickness ranging from 5 µm to 10 µm.

Figure 5J:
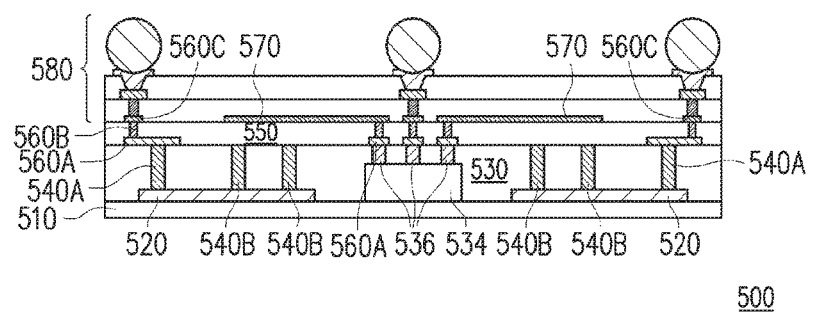

At operation 450, in some embodiments, additional elements 580 are formed to provide electrical connections between ground planes 520, patches 570, RF die 534, and external elements, and one or more processes are performed to remove antenna structure 500 from carrier 500C and LTHC coating 500L, as depicted in FIG. 5J. In some embodiments, forming additional elements 580 includes forming one or more of signal paths 260D, 260E, 260F, and 260G, and insulation layers 280 and 290, discussed above with respect to antenna structure 200 and FIGS. 2A and 2B.

The operations of method 400 are usable to form an antenna structure that includes a high-k dielectric layer and a cavity between each patch and ground plane, thereby obtaining the benefits discussed above with respect to antenna structures 100 and 200.

Because the operations of method 400 are capable of being performed as part of a method of forming an IC package, method 400 provides a low-cost approach for integrating an antenna structure with an IC package. Further, an antenna structure formed by using method 400 has a frequency response dominated by the high-k dielectric layer and geometries of the patches and ground planes. Method 400 thereby allows other IC package dimensions, such as molding compound thickness, to be varied while maintaining desired frequency response characteristics, providing significant design flexibility.

Figure 6:
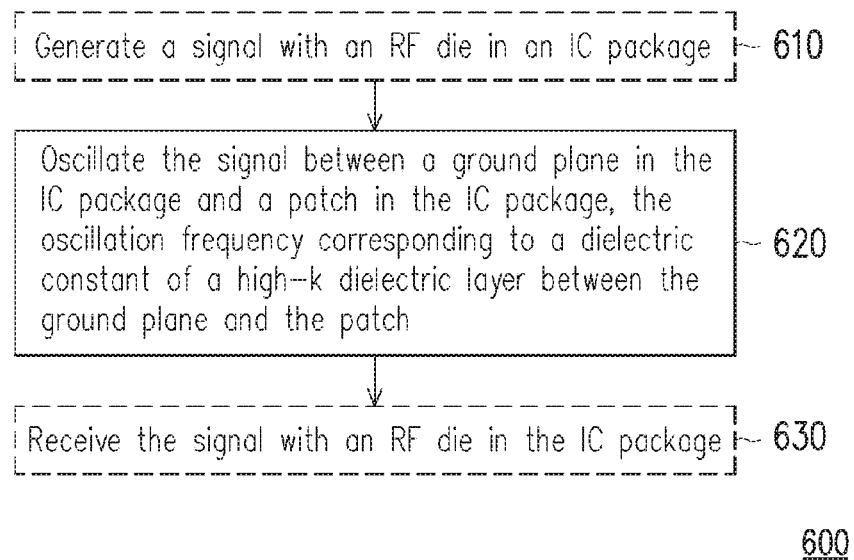
FIG. 6 is a flowchart of a method of communicating a signal, in accordance with some embodiments

FIG. 6 is a flowchart of a method 600 of communicating a signal, in accordance with one or more embodiments. Method 600 is usable with an antenna structure, e.g., antenna structure 100 (FIGS. 1A and 1B) or antenna structure 200 (FIGS. 2A and 2B).

At operation 610, in some embodiments, a signal is generated with an RF die in an IC package. In some embodiments, generating a signal with an RF die includes generating a signal with RF die 234, discussed above with respect to antenna structure 200 and FIGS. 2A and 2B.

In some embodiments, generating a signal includes generating the signal having a frequency ranging from 100 megahertz (MHz) to 120 gigahertz (GHz). In some embodiments, generating a signal includes generating the signal having a frequency ranging from 28 GHz to 77 GHz.

In some embodiments, generating a signal with an RF die includes propagating the signal within an IC package containing the RF die. In some embodiments, generating a signal with an RF die includes propagating the signal to antenna structure 100, discussed above with respect to FIGS. 1A and 1B. In some embodiments, generating a signal with an RF die includes propagating the signal within antenna structure 200, discussed above with respect to FIGS. 2A and 2B.

At operation 620, the signal is oscillated between a ground plane in an IC package and a patch in the IC package, the oscillation frequency corresponding to a dielectric constant of a high-k dielectric layer between the ground plane and the patch. In some embodiments, oscillating the signal includes oscillating the signal between ground plane 120 and patch 170, discussed above with respect to antenna structure 100 and FIGS. 1A and 1B. In some embodiments, oscillating the signal includes oscillating the signal between a ground plane 220 and a patch 270, discussed above with respect to antenna structure 200 and FIGS. 2A and 2B.

In some embodiments, the oscillation frequency corresponds to a dielectric constant of high-k dielectric layer 150, discussed above with respect to antenna structure 100 and FIGS. 1A and 1B. In some embodiments, the oscillation frequency corresponds to a dielectric constant of high-k dielectric layer 250, discussed above with respect to antenna structure 200 and FIGS. 2A and 2B. In some embodiments, the oscillation frequency corresponds to point F0, discussed above with respect to FIG. 3.

In some embodiments, oscillating the signal between the ground plane and the patch includes oscillating the signal in a cavity formed by the ground plane and a through-insulator via (TIV) arrangement. In some embodiments, oscillating the signal includes oscillating the signal in cavity 130C, discussed above with respect to antenna structure 100 and FIGS. 1A and 1B. In some embodiments, oscillating the signal includes oscillating the signal in a cavity 230C, discussed above with respect to antenna structure 200 and FIGS. 2A and 2B.

In some embodiments, oscillating the signal includes oscillating the signal between the ground plane and another patch in the IC package, the high-k dielectric layer being between the ground plane and another patch. In some embodiments, the patch and the another patch are separated by a distance corresponding to half a free space wavelength of the signal. In some embodiments, oscillating the signal includes oscillating the signal between a single ground plane 220 and more than one patch 270, discussed above with respect to antenna structure 200 and FIGS. 2A and 2B.

In some embodiments, oscillating the signal includes oscillating the signal between another ground plane in the IC package and another patch in the IC package, the high-k dielectric layer being between the another ground plane and the another patch. In some embodiments, oscillating the signal includes oscillating the signal between a first ground plane 220 and a first patch 270, and oscillating the signal between a second ground plane 220 and a second patch 270, discussed above with respect to antenna structure 200 and FIGS. 2A and 2B.

In some embodiments, oscillating the signal between the ground plane and the patch corresponds to transmitting and/or receiving the signal in a first direction, and oscillating the signal between the another ground plane and the another patch corresponds to transmitting and/or receiving the signal in a second direction opposite the first direction.

At operation 630, in some embodiments, the signal is received with an RF die in the IC package. In some embodiments, receiving the signal with an RF die includes receiving a signal with RF die 234, discussed above with respect to antenna structure 200 and FIGS. 2A and 2B.

In some embodiments, receiving the signal with an RF die includes propagating the signal within an IC package containing the RF die. In some embodiments, receiving the signal with an RF die includes propagating the signal from antenna structure 100, discussed above with respect to FIGS. 1A and 1B. In some embodiments, receiving the signal with an RF die includes propagating the signal within antenna structure 200, discussed above with respect to FIGS. 2A and 2B.

By performing the operations of method 600, a signal has a frequency corresponding to a dielectric constant of a high-k dielectric layer between a ground plane and a patch, the signal therefore being communicated in accordance with the benefits discussed above with respect to antenna structures 100 and 200 and method 400.

In some embodiments, an antenna structure includes a ground plane in a first metal layer of an IC package, a patch in a second metal layer of the IC package, a cavity structure between the ground plane and the patch, and a high-k dielectric layer between the ground plane and the patch.

In some embodiments, a method of forming an antenna structure includes forming a ground plane in an IC package, forming a plurality of TIVs on the ground plane, depositing a high-k dielectric layer overlying the ground plane and the plurality of TIVs, and forming a patch in the IC package, the patch overlying the high-k dielectric layer and the ground plane and having a perimeter corresponding to an arrangement of the plurality of TIVs.

In some embodiments, a method of communicating a signal includes oscillating a signal between a ground plane in an IC package and a patch in the IC package, an oscillation frequency of the signal corresponding to a dielectric constant of a high-k dielectric layer between the ground plane and the patch, and at least one of generating or receiving the signal with an RF die in the IC package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An antenna structure comprising:
   a ground plane in a first metal layer of an integrated circuit (IC) package;
   a patch in a second metal layer of the IC package;
   a cavity structure between the ground plane and the patch, wherein at least a portion of the cavity structure is formed by the ground plane; and
   a high-k dielectric layer between the ground plane and the patch.

2. The antenna structure of claim 1, further comprising:
   a signal path in a third metal layer of the IC package overlying the first metal layer; and
   a through-insulator via (TIV) electrically coupling the ground plane to the signal path.

3. The antenna structure of claim 1, wherein the cavity structure comprises a molding compound between the ground plane and the high-k dielectric layer.

4. The antenna structure of claim 1, wherein the cavity structure comprises a plurality of through-insulator vias (TIVs) between the ground plane and the patch, the plurality of TIVs being electrically connected to the ground plane and positioned in an arrangement corresponding to a perimeter of the patch.

5. The antenna structure of claim 1, wherein the high-k dielectric layer comprises at least one of titanium dioxide, strontium titanate, barium titanate, barium strontium titanate, or lead zirconate titanate.

6. The antenna structure of claim 1, wherein the IC package comprises a radio frequency (RF) die electrically connected to the patch, the RF die configured to receive and/or transmit an RF signal with the antenna structure.

7. The antenna structure of claim 1, wherein
   the ground plane is one ground plane of a plurality of ground planes, and
   the patch is one patch of a plurality of patches.

8. The antenna structure of claim 7, wherein
   a number of ground planes in the plurality of ground planes is two, and
   a number of patches in the plurality of patches is four.

9. A method of forming an antenna structure, the method comprising:
   forming a ground plane in an integrated circuit (IC) package;
   forming a plurality of through-insulator vias (TIVs) on the ground plane;
   depositing a high-k dielectric layer overlying the ground plane and the plurality of TIVs; and
   forming a patch in the IC package, the patch overlying the high-k dielectric layer and the ground plane and having a perimeter corresponding to an arrangement of the plurality of TIVs.

10. The method of claim 9, wherein
    the patch is one patch of a plurality of patches, and
    the forming the patch in the IC package comprises forming the plurality of patches overlying the high-k dielectric layer and the ground plane.

11. The method of claim 9, wherein the depositing the high-k dielectric layer comprises depositing the high-k dielectric layer at a temperature below 200° C.

12. The method of claim 9, wherein the depositing the high-k dielectric layer comprises using a physical vapor deposition (PVD), chemical vapor deposition (CVD), or a laser chemical vapor deposition (LCVD) process.

13. The method of claim 9, wherein the depositing the high-k dielectric layer comprises depositing the high-k dielectric to a thickness ranging from 1 micrometer ($\mu$m) to 4 $\mu$m.

14. The method of claim 9, wherein the depositing the high-k dielectric layer comprises depositing at least one of titanium dioxide, strontium titanate, barium titanate, barium strontium titanate, or lead zirconate titanate.

15. The method of claim 9, further comprising forming an insulation layer overlying the ground plane, wherein the depositing the high-k dielectric layer comprises depositing the high-k dielectric layer overlying the insulation layer.

16. The method of claim 15, further comprising forming a through-insulator via (TIV) on the ground plane, wherein the forming the insulation layer comprises surrounding the TIV with a molding compound.

17. A method of communicating a signal, the method comprising:
    oscillating a signal in a cavity between a ground plane in an integrated circuit (IC) package and a patch in the IC package, wherein an oscillation frequency of the signal corresponds to a dielectric constant of a high-k dielectric layer between the ground plane and the patch, wherein at least a portion of the cavity is formed by the ground plane; and
    at least one of generating or receiving the signal with a radio frequency (RF) die in the IC package.

18. The method of claim 17, wherein oscillating the signal between the ground plane and the patch comprises oscillating the signal in the cavity and a through-insulator via (TIV) arrangement.

19. The method of claim 17, further comprising oscillating the signal between the ground plane and another patch, wherein
    the high-k dielectric layer is between the ground plane and the another patch, and
    the patch and the another patch are separated by a distance corresponding to half a free space wavelength of the signal.

20. The method of claim 17, further comprising oscillating the signal between another ground plane and another patch, the high-k dielectric layer being between the another ground plane and the another patch, wherein the oscillating the signal between the ground plane and the patch corresponds to transmitting and/or receiving the signal in a first direction, and the oscillating the signal between the another ground plane and the another patch corresponds to transmitting and/or receiving the signal in a second direction opposite the first direction.

* * * * *